(12) United States Patent
Newton et al.

(10) Patent No.: US 6,437,981 B1
(45) Date of Patent: Aug. 20, 2002

(54) THERMALLY ENHANCED MICROCIRCUIT PACKAGE AND METHOD OF FORMING SAME

(75) Inventors: Charles M. Newton, Palm Bay; Carol A. Gamlen; Raymond C. Rumpf, Jr., both of Melbourne, all of FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/727,140

(22) Filed: Nov. 30, 2000

(51) Int. Cl.[7] ................................................ H05K 7/20
(52) U.S. Cl. ...................... 361/700; 361/698; 361/699; 257/715; 174/15.2; 165/80.4; 165/104.26; 165/104.33
(58) Field of Search ................................ 361/698, 699, 361/700, 711; 257/714, 715, 716; 174/15.1, 15.2; 165/80.4, 104.21, 104.28, 104.33; 62/259.2

(56) References Cited

U.S. PATENT DOCUMENTS

| | | | |
|---|---|---|---|
| 5,121,089 A | 6/1992 | Larson | 333/107 |
| 5,268,812 A * | 12/1993 | Conte | 361/698 |
| 5,309,457 A | 5/1994 | Minch | 372/34 |
| 5,498,905 A | 3/1996 | Young | 257/700 |
| 5,598,632 A | 2/1997 | Camarda et al. | 29/890.032 |
| 5,611,876 A | 3/1997 | Newton et al. | 156/89 |
| 5,638,946 A | 6/1997 | Zavracky | 200/181 |
| 5,661,647 A | 8/1997 | Washburn et al. | 363/147 |
| 5,665,249 A | 9/1997 | Burke et al. | 216/2 |
| 5,708,570 A | 1/1998 | Pollinski, Sr. | 361/762 |
| 5,801,442 A * | 9/1998 | Hamilton et al. | 257/714 |
| 5,859,763 A * | 1/1999 | Nam et al. | 361/699 |
| 5,867,990 A | 2/1999 | Ghoshal | 62/3.7 |
| 5,919,325 A | 7/1999 | Goebel et al. | 156/89.16 |
| 5,933,323 A * | 8/1999 | Bhatia et al. | 361/700 |
| 5,963,856 A | 10/1999 | Kim | 455/307 |
| 5,966,941 A | 10/1999 | Ghoshal | 62/3.7 |
| 5,966,957 A * | 10/1999 | Malhammar et al. | 62/259.2 |
| 5,969,848 A | 10/1999 | Lee et al. | 359/298 |
| 5,982,250 A | 11/1999 | Hung et al. | 333/26 |
| 6,020,564 A | 2/2000 | Wang et al. | 200/181 |
| 6,046,659 A | 4/2000 | Loo et al. | 333/262 |
| 6,070,656 A | 6/2000 | Dickey | 165/114.26 |
| 6,133,631 A * | 10/2000 | Belady | 257/714 |
| 6,292,365 B1 * | 9/2001 | Ashiwake et al. | 361/700 |

* cited by examiner

*Primary Examiner*—Boris Chervinsky
(74) *Attorney, Agent, or Firm*—Allen, Dyer, Doppelt, Milbrath & Gilchrist, P.A.

(57) ABSTRACT

A thermally enhanced microcircuit package includes a microcircuit package having a microcircuit device cavity that receives a microcircuit device. A microelectromechanical (MEMS) cooling module is operatively connected to the microcircuit package and forms a capillary pumped loop cooling circuit having an evaporator, condenser and interconnecting cooling fluid channels for passing vapor and fluid between the evaporator and condenser and evaporating and condensing the cooling fluid. The evaporator is operatively associated with the microcircuit device for cooling the device when in use.

26 Claims, 8 Drawing Sheets

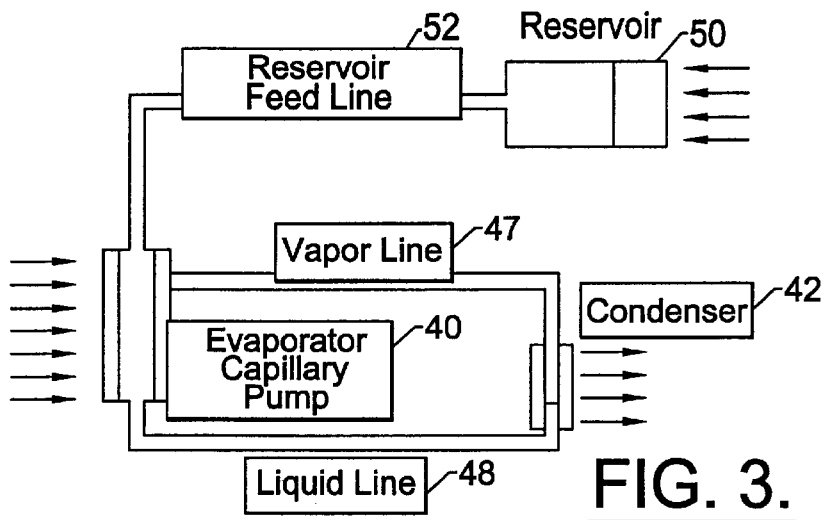
FIG. 3.
Micro-CPL specifications.
| | |
|---|---|
| condenser area | 2.5+05 sq. micron |
| evaporator length | 1000 micron |
| groove height | 50 micron |
| groove width/number | 50 micron/5 |
| vapor line hyd. dia. | 200 micron (300x150 micron) |
| liquid line hyd. dia. | 150 micron (150x150 micron) |
| max. Reynolds no. | |
| liquid line | Re = 28 |
| vapor line | Re = 434 |
FIG. 4.
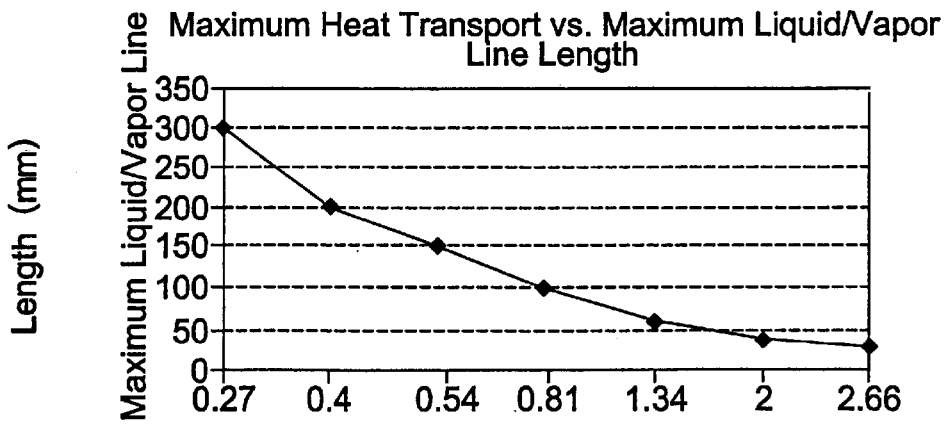
FIG. 5.

1) Thermal Oxide Deposition (2μm)

2) Photolithography

3) Plasma Etch to Pattern Oxide Layer

4) Second Photolithography

5) DRIE (Deep Reactive Ion Etching) of Through-hole

6) Second DRIE to create fluidic channels

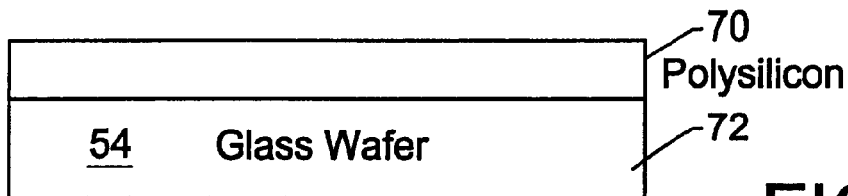
1) Undoped Polysilicon Deposition (1.4μm)   FIG. 13.
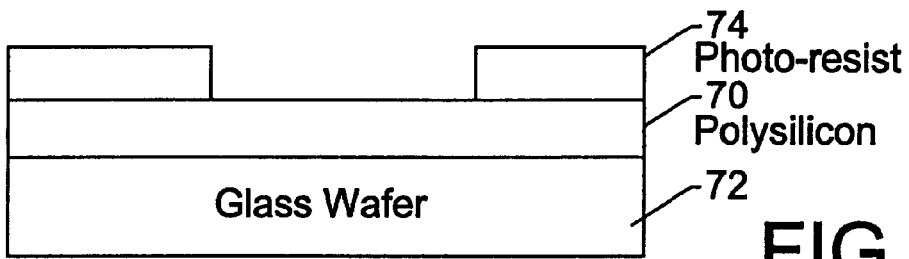
2) Photolithography   FIG. 14.
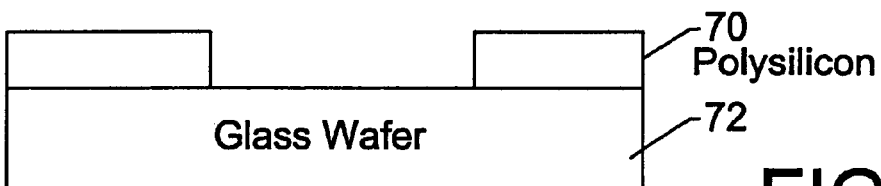
3) Plasma Etch to Pattern Polysilicon Layer   FIG. 15.
4) Wet Etch using Concentrated HF   FIG. 16.

THERMALLY ENHANCED MICROCIRCUIT PACKAGE AND METHOD OF FORMING SAME

FIELD OF THE INVENTION

This invention relates to cooling devices for semiconductor and microcircuit devices, and more particularly, this invention relates to a microcircuit package with enhanced cooling.

BACKGROUND OF THE INVENTION

More advanced electronic semiconductor and microcircuit devices used in military and advanced commercial systems demand advanced, state-of-the-art and compact electronic devices for multiple applications. Power transistors used as switches require high heat flux applications and transmit/receive modules require isothermal maintenance. Many of the thermal management approaches applied in the past no longer work adequately in these types of demanding applications. This is especially relevant in advanced aircraft systems used in commercial and military apparatus.

New microcircuit designs are adapted for use with more maneuverable aircraft, higher power and density avionics, and more stealth-like aircraft. These advanced electronic systems generate increased heat and must be kept cool for efficient operation.

Some prior art systems have used different types of heat sinks. These systems had high quiescent losses in hydraulic systems, inefficient mechanical pumps, and inefficient air-cycle refrigeration systems, thus demanding the use of extensive heat sinks. Also, with the increased use of variable displacement/variable pressure hydromechanical systems, more innovative heat sinks and thermal capacitors have been designed and used. For example, some plastic or ceramic encapsulated devices have a copper slab heat sink with a bare back. Heat transfers through the leads to an attached PCB by conduction in copper traces. Large integrated microcircuit systems are operative with these heat sinks, but have not always been adequate.

With the increase in the number of complicated and smaller "footprint" electronics and electronically controlled systems in aircraft, there are new concentrated heat loads and harsher environments for MEA equipment (e.g., engine IS/G and stabiliator actuators). There are also increased thermal challenges in reducing the weight and volume of MEA and similar components, such as from: (a) advanced localized cooling techniques; (b) enhanced heat transfer technologies; (c) micro-cooling technologies; (d) packaging concepts for high heat flux applications; (e) low loss/high temperature power semiconductors; and (f) high temperature motor/generators. These enhanced heat transfer requirements for high heat flux and high density packaging require more advanced cooling systems to be applied directly to individual integrated circuits for integral cooling of these circuits. Closed loop systems may be necessary in more advanced systems and should be self-contained, relative to the individual components, and not rely on a larger system application.

SUMMARY OF THE INVENTION

It is therefore an object of the present invention to provide a more efficient and thermally enhanced microcircuit package that provides integral cooling to microcircuit devices, such as semiconductor power transistors.

It is still another object of the present invention to provide a thermally enhanced microcircuit package that provides integral cooling to a microcircuit device.

In accordance with the present invention, a thermally enhanced microcircuit package includes a microcircuit package having a microcircuit device cavity, which receives a microcircuit device. A microelectromechanical (MEMS) cooling module is operatively connected to the microcircuit package. This cooling module includes a capillary pumped loop cooling circuit having an evaporator, condenser and interconnecting cooling fluid channels for passing vapor and fluid between the evaporator and condenser and evaporating and condensing the cooling fluid. The evaporator is operatively associated with the microcircuit device for cooling the device when in use.

In one aspect of the present invention, the capillary pumped loop cooling circuit is formed on a silicon base, i.e., silicon wafer, and includes an evaporator, condenser and interconnecting cooling fluid channels formed in the silicon base. In another aspect of the present invention, the evaporator can be formed with at least a portion within the microcircuit package.

In yet another aspect of the present invention, the thermally enhanced microcircuit package is a ball grid array package formed from low temperature co-fired ceramic (LTCC), and has a ball grid array, as known to those skilled in the art, and microcircuit device cavity that receives a microcircuit device, which can be an insulated gate bipolar transistor (IGBT) and ribbon bonded to the ball grid array, by techniques known to those skilled in the art. A cooling fluid reservoir is operatively connected to the evaporator. A wicking structure is formed within the evaporator in one aspect of the present invention. The evaporator and condenser can be formed of a plurality of grooves, each having a height and width of about 25 to about 150 microns. The cooling fluid channels can also be formed as a plurality of vapor lines and a plurality of liquid lines, each having a length substantially greater than the width and height.

A method of forming a microelectromechanical (MEMS) cooling module is also disclosed, and comprises the step of deep reactive ion etching (DRIE) a silicon wafer, and oxide layer deposited thereon, to form a condenser, evaporator and interconnecting cooling fluid channels that are configured for attachment to an integrated circuit package. This step can include a first deep reactive ion etching step to form a through-hole, and a second deep reactive ion etching step to form cooling fluid channels, including the evaporator and condenser. The method can also include the step of plasma etching the deposited oxide layer to pattern the silicon wafer.

BRIEF DESCRIPTION OF THE DRAWINGS

Other objects, features and advantages of the present invention will become apparent from the detailed description of the invention which follows, when considered in light of the accompanying drawings in which:

FIG. 3 is a block diagram showing the operative components of the thermally enhanced microcircuit package of FIG. 1.

FIG. 4 are non-limiting examples of specifications for a thermally enhanced microcircuit package, such as shown in FIG. 1.

FIG. 5 is a graph showing maximum heat transport versus maximum liquid/vapor line length of an example of a thermally enhanced microcircuit package, such as shown in FIG. 1.

FIGS. 13–16 are diagrams illustrating the fabrication of a wicking structure in a glass cover plate.

DETAILED DESCRIPTION OF THE PREFERRED EMBODIMENTS

Figure 1:
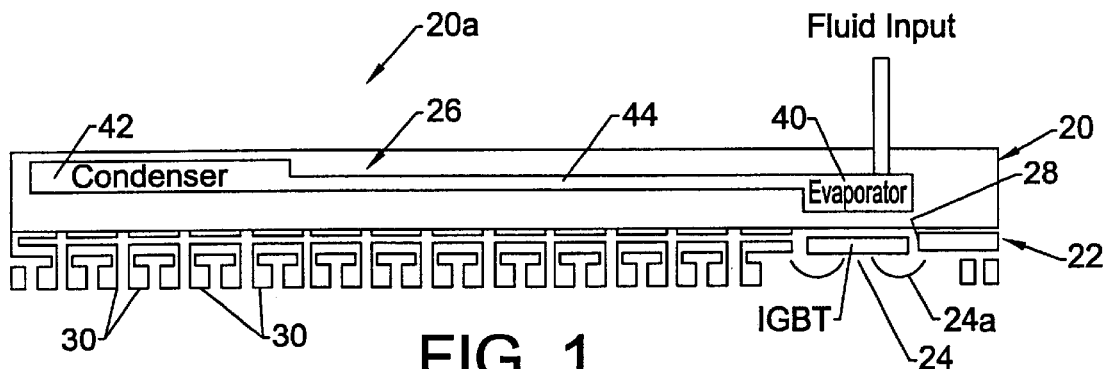
FIG. 1 is a schematic, sectional diagram of a thermally enhanced microcircuit package of the present invention, formed as a ball grid array package, and having a microelectromechanical cooling module attached thereto.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention is directed to a thermally enhanced microcircuit package 20a and is advantageous because it provides a microelectromechanical (MEMS) cooling module 20 that is operatively connected to a microcircuit package 22, such as the illustrated ball grid array package used for packaging a microcircuit device. An example of such a device is the insulated gate bipolar transistor (IGBT) 24. The cooling module 20 has a capillary pumped loop circuit 26 to provide integral cooling to the microcircuit device that is received within a microcircuit device cavity 28 of the package, which in the illustrated embodiment, is formed as a ball grid array package. For purposes of description, the microcircuit package will be described herein as a ball grid array package, but different types of electronic device packages can be used with the present invention.

The ball grid array package 22 is formed from a low temperature co-fired ceramic (LTCC) material in one aspect, as is known to those skilled in the art, and includes the microcircuit device cavity 28 and receives the microcircuit device in the form of the illustrated insulated gate bipolar transistor 24, such as commonly used for power and other intensive applications, as known to those skilled in the art.

Insulated gate bipolar transistors are powerful transistors that can switch up to 1000 amperes. As is known to those skilled in the art, MOSFET and bipolar transistors are combined to create the IGBT. Current flow is enabled by the application of voltage to a metal gate where the voltage sets up an electric field that repels positively charged holes away from the gate. At the same time, it attracts electrons, forming the N-channel through which the current flows. In the P-N-P bipolar transistor formed as part of the IGBT, a small control current adds electrons to the base, and attracts holes from the emitter. These holes flow from the emitter to the collector and form a large working current. A control voltage is applied to a MOSFET and establishes a working current, which in turn, is applied as a control current to the base of the P-N-P bipolar transistor forming part of the IGBT. This control current allows the larger working current to flow in the bipolar transistor. Thus, the working current of the IGBT is the combined working currents of both the MOSFET and the bipolar transistor, allowing this type of device to have a power gain of about 10 million, corresponding to the ratio of the working current and voltage to the control current and voltage. This gain allows this device to connect to microelectronic circuits that can be monolithically formed with other circuits to form a power device, such as an IGBT power device.

The ball grid array package 22 includes a ball grid array 30 formed from solder or other known materials, and uses ball grid array fabrication techniques known to those skilled in the art, including the use of ceramic material, such as low temperature co-fired ceramic. The insulated gate bipolar transistor 24 can be ribbon bonded by a ribbon bond 24a or other bonding techniques to the ball grid array 30 by techniques known to those skilled in the art. For example, the insulated gate bipolar transistor could be part of a device structure having a backside that is bonded and circuit connected, as known to those skilled in the art.

Figure 6:
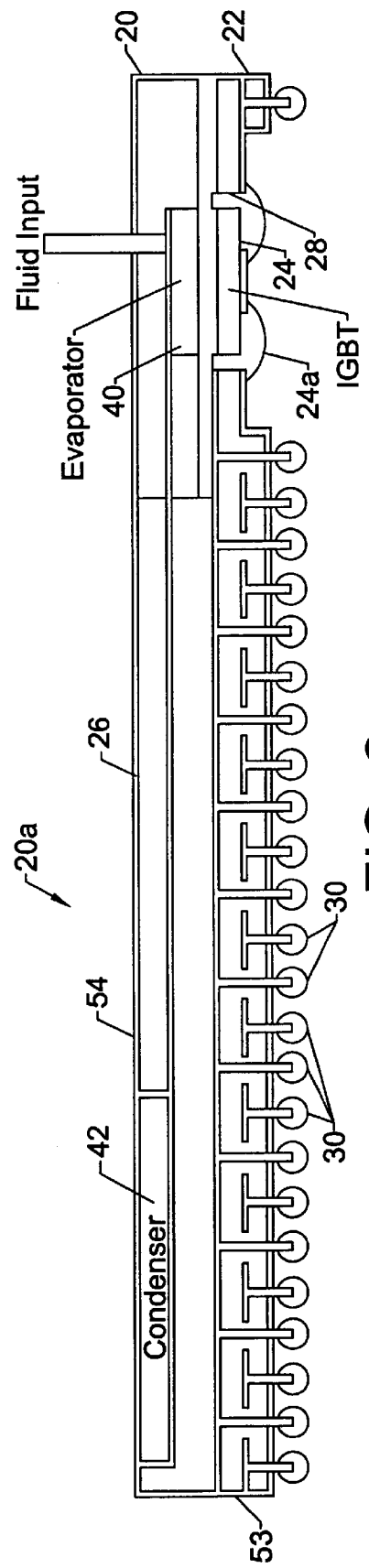
FIG. 6 is an enlarged schematic, sectional view of a thermally enhanced microcircuit package, such as shown in FIG. 1.

In accordance with the present invention, the microelectromechanical (MEMS) cooling module 20 is operatively connected to the ball grid array package 22 as shown in FIGS. 1 and 6. This cooling module includes the capillary pumped loop cooling circuit 26 having an evaporator 40, condenser 42, and interconnecting cooling fluid channels 44 for passing vapor and fluid between the evaporator and condenser and evaporating and condensing the cooling fluid.

As shown in FIG. 3, the basic components of the microelectromechanical cooling module 20 include the condenser 42 and evaporator 40, which is operative as an evaporator capillary pump. The evaporator 40 includes a wicking structure 46 to aid in wicking fluid during operation by wicking effect known to those skilled in the art. The interconnecting cooling fluid channels 44 are formed as a plurality of vapor lines 47 and a plurality of liquid lines 48, each having a length substantially greater than the width and height, as shown in the schematic isometric views of FIGS. 17A and 17B. A fluid reservoir 50 can be operative with the evaporator 40 and connected to the evaporator by a reservoir feed line 52, as shown in FIG. 3. Heat is drawn from the microcircuit device, e.g., insulated gate bipolar transistor, and returned via the vapor line 47 to the condenser 42, which condenses the vapor and then returns liquid to the evaporator by the capillary pumped action, aided by the wicking structure 46.

The microelectromechanical cooling module 20 of the present invention can be formed by standard microcircuit fabrication techniques within a silicon base, i.e., a silicon wafer. The module 20 has a glass cover 54 positioned over the silicon base 53, and enclosing the evaporator 40, condenser 42 and interconnecting cooling fluid channels 44, as shown in FIGS. 17B and 18B in one aspect of the present invention.

Figure 7:
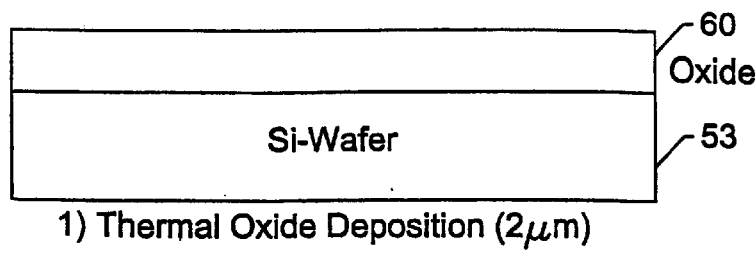
FIGS. 7–12 are diagrams showing the sequence of steps for fabricating in silicon the interconnecting cooling fluid channels, evaporator and condenser.
Figure 8:
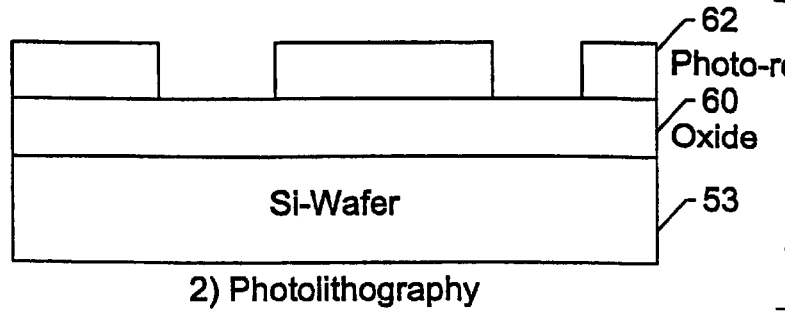
Figure 9:
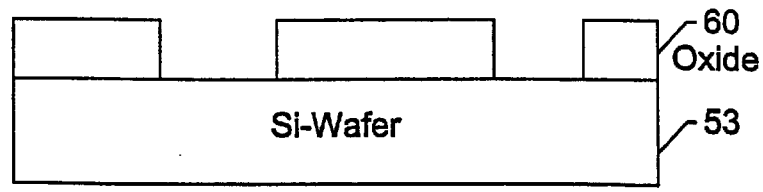
Figure 10:
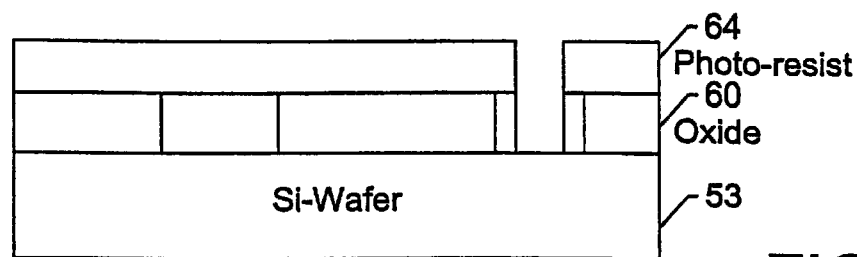
Figure 11:
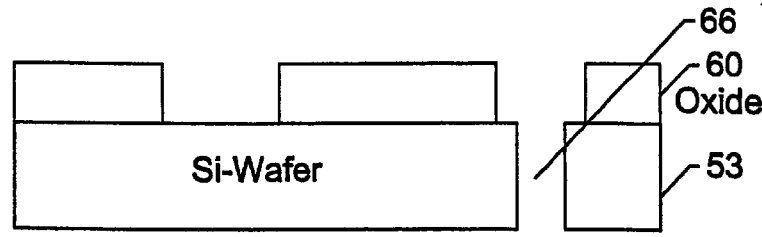
Figure 12:
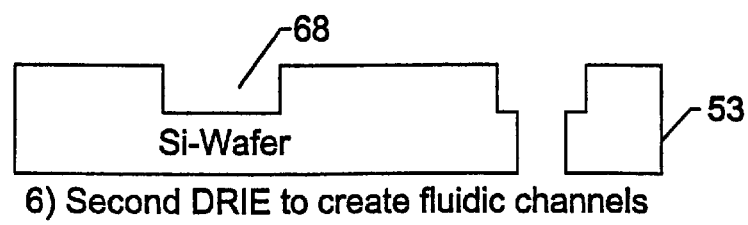

FIGS. 7–12 illustrate basic structural diagrams showing the steps used in fabricating these components in silicon. As shown in FIG. 7, the silicon wafer 53 has a thermal oxide film 60 deposited in a thickness, such as two micrometers thick. This deposition is followed by photolithography, as shown in FIG. 8, where a photoresist 62 is applied to the oxide, and then plasma etched to pattern the channels, as shown in FIG. 9. A second photoresist 64 is placed on the oxide, and a second photolithography step accomplished as shown in FIG. 10. A first deep reactive ion etching (DRIE) occurs of the through-hole 66, followed by a second deep reactive ion etching as shown in FIG. 12, to create cooling fluid channels 68.

FIGS. 13–16 illustrate the steps used for fabricating the wicking structure in the glass cover plate 54, which can be used with the present invention. This glass cover plate can be formed, aligned with, and anodically bonded to the silicon wafer, completing fabrication of the micro capillary pumped loop cooling circuit that forms a closed loop circuit, as explained before. In a first step, an undoped polysilicon 70 is deposited to about 1.4 micrometers on a glass wafer 72. A photoresist 74 is applied, as shown in FIG. 14, followed by a photolithography step. In FIG. 15, the polysilicon 70 is plasma etched to pattern that polysilicon layer, followed by a wet etch using concentrated hydrochloric acid to form the wicking structure on the glass wafer, which is then anodically bonded to the silicon wafer, thus completing fabrication.

FIG. 4 illustrates basic specifications of a thermally enhanced microcircuit, such as shown in FIG. 6, with the different condenser area, evaporator length, groove height, groove width/number, vapor line hydraulic diameter, liquid line hydraulic diameter, maximum reynolds number for the liquid line and vapor line. These figures only give an example of what types of package could be fabricated in accordance with the present invention.

FIG. 5 illustrates a graph showing the maximum heat transport versus the maximum liquid/vapor line length, showing the maximum liquid/vapor line length in millimeters on the vertical axis, and the total Q, in watts (W), on the horizontal axis.

Figure 2:
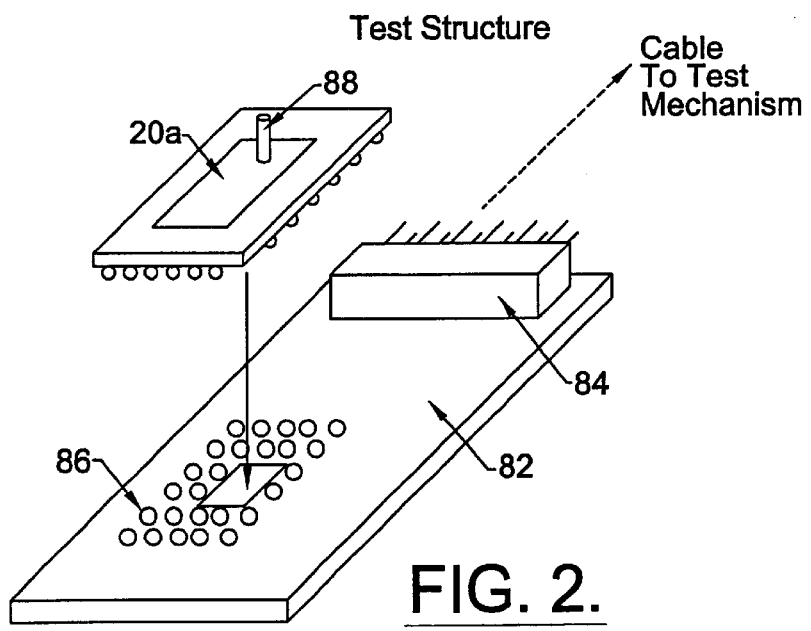
FIG. 2 is a schematic, isometric view of a test structure for testing the thermally enhanced microcircuit package shown in FIG. 1.

FIG. 2 illustrates a test fixture 80 that could be used for testing the thermally enhanced microcircuit package 20a of the present invention and shows a printed wire board (PWB) 82 with a connector 84 that would have a cable attached thereto for connection to a test mechanism. A flush, ball grid array (BGA) socket 86 receives a carrier 88 holding the thermally enhanced microcircuit package, i.e., the thermally enhanced ball grid array (TBGA) package for the insulated gate bipolar transistor.

Figure 17A:
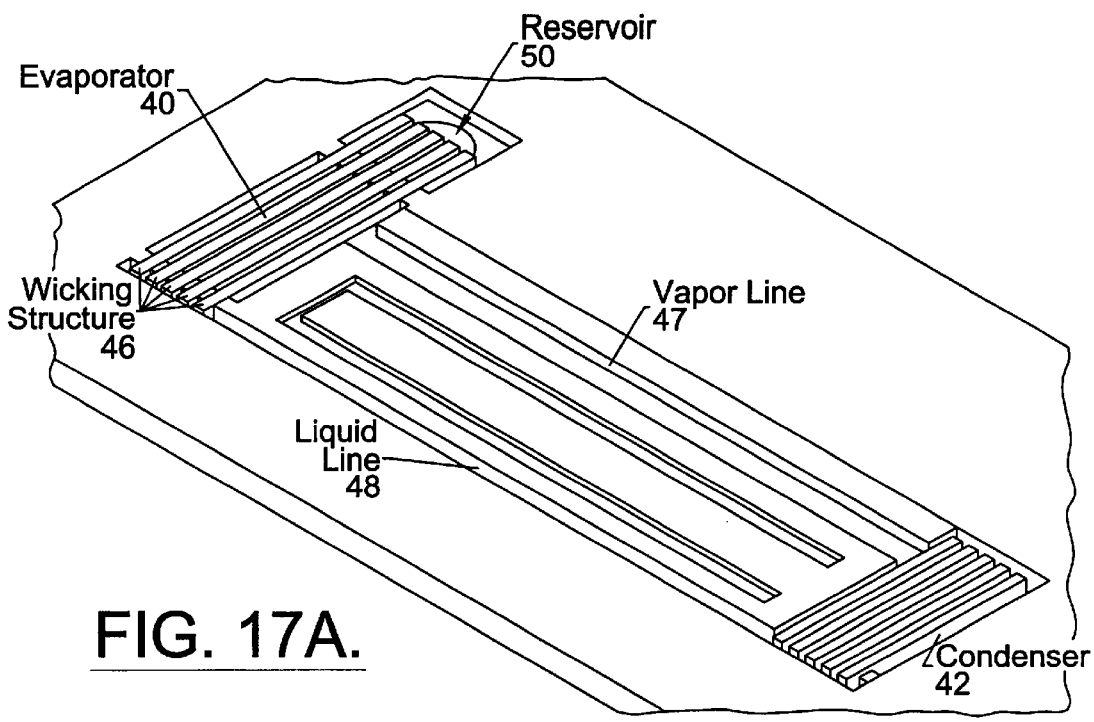
FIG. 17A is a schematic, isometric view of the silicon base, i.e., silicon wafer, and showing the evaporator, condenser and the interconnecting cooling fluid channels for passing vapor and fluid between the evaporator and condenser, in accordance with a first embodiment of the thermally enhanced microcircuit package.
Figure 17B:
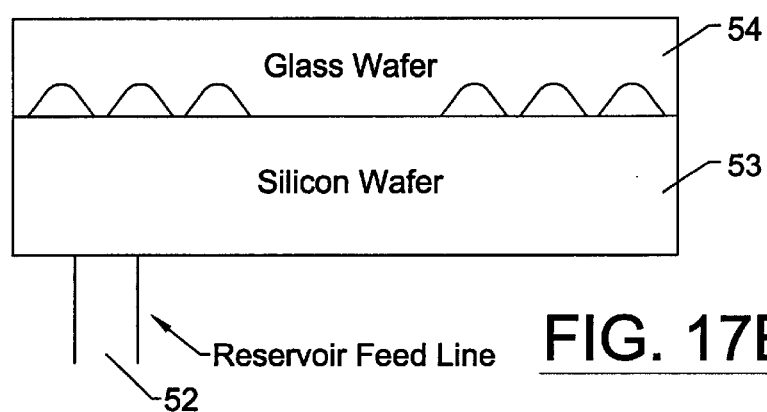
FIG. 17B is a schematic, sectional view of the microcircuit package of FIG. 17A, showing the relationship between the glass wafer and silicon wafer, and the use of a reservoir with the evaporator.

FIG. 17A illustrates a first embodiment of the package 20a, and showing the wicking structure 46 received within the evaporator 40, and the fluid 50 reservoir associated with the evaporator. The vapor lines and liquid lines are connected to the condenser 42 as described before. FIG. 17B is a cross section of the structure shown in FIG. 17A.

The structure in FIG. 17A, as a non-limiting example, can have the following examples (A and B) of specifications for an operative insulated gate bipolar transistor ball grid array package as illustrated:

|  | A | B |
| --- | --- | --- |
| Evaporator Length | 1000 microns | 1000 microns |
| Evaporator Width | 50 microns | 500 microns |
| Condenser Area | 5.0e + 05 sq. microns | 5.0e + 05 sq. microns |

-continued

|  | A | B |
| --- | --- | --- |
| Groove Height | 50 microns | 50 microns |
| Groove Width/Number | 50 microns/4 | 50 microns/4 |
| Vapor Line Width | 150 × 350 microns | 150 × 450 microns |
| Liquid Line Width | 150 × 150 microns | 150 × 150 microns |
| Vapor/Liquid Line Length | 25 mm | 35 mm |
| Liquid Line Re Number | 28 | 43 |
| Vapor Line Re Number | 434 | 494 |
| Projected Heat Removal | 4 watts | 4 watts |

Figure 18A:
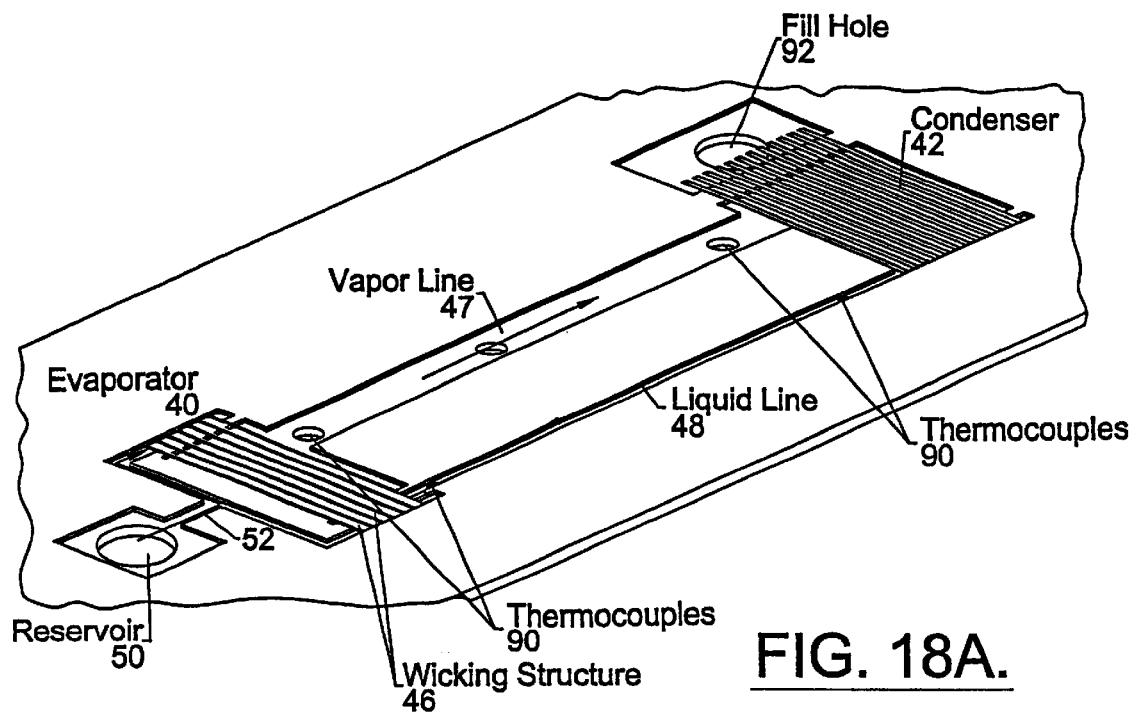
FIGS. 18A and 18B are views similar to FIGS. 17A and 17B, but showing a fill line operative with a condenser, and the addition of thermocouple wells for containing thermocouples that are used for temperature testing the circuit.
Figure 18B:
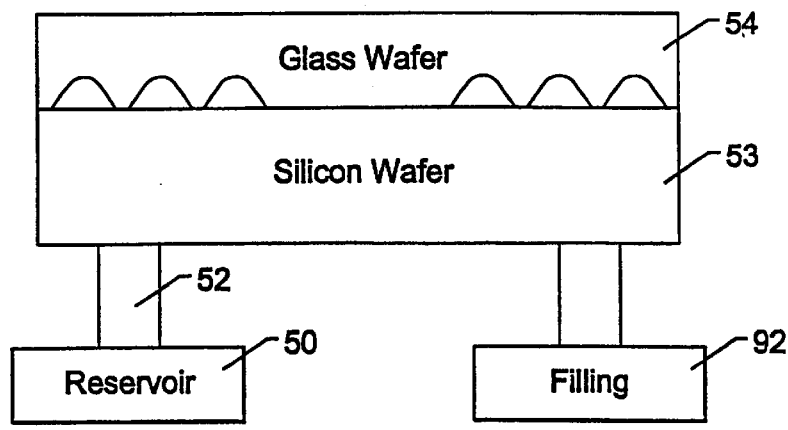

FIGS. 18A and 18B show another embodiment where the fluid reservoir 50 is spaced, as shown in FIG. 18A. Thermocouple receiving wells 90 are formed in the vapor lines and liquid lines for receiving thermocouples that measure temperature. A fill hole 92 is operatively connected by filling lines to the condenser, while a separate fluid reservoir is connected by the reservoir feed line to the evaporator, as shown in FIGS. 18A and 18B.

As a non-limiting example, the structure of FIGS. 18A and 18B can have various dimensions, and as an example, are:

|  | A | B |
| --- | --- | --- |
| Evaporator Length | 2000 microns | 2000 microns |
| Evaporator Width | 1000 microns | 1000 microns |
| Condenser Area | 2.0e + 06 sq. microns | 2.0e + 06 sq. microns |
| Groove Height | 50 microns | 50 microns |
| Groove Width/Number | 50 microns/8 | 50 microns/8 |
| Vapor Line Width | 150 × 350 microns | 150 × 450 microns |
| Liquid Line Width | 150 × 150 microns | 150 × 150 microns |
| Vapor/Liquid Line Length | 25 mm | 35 mm |
| Liquid Line Re Number | 42 | 42 |
| Vapor Line Re Number | 578 | 488 |
| Projected Heat Removal | 4 watts | 4 watts |

Figure 19:
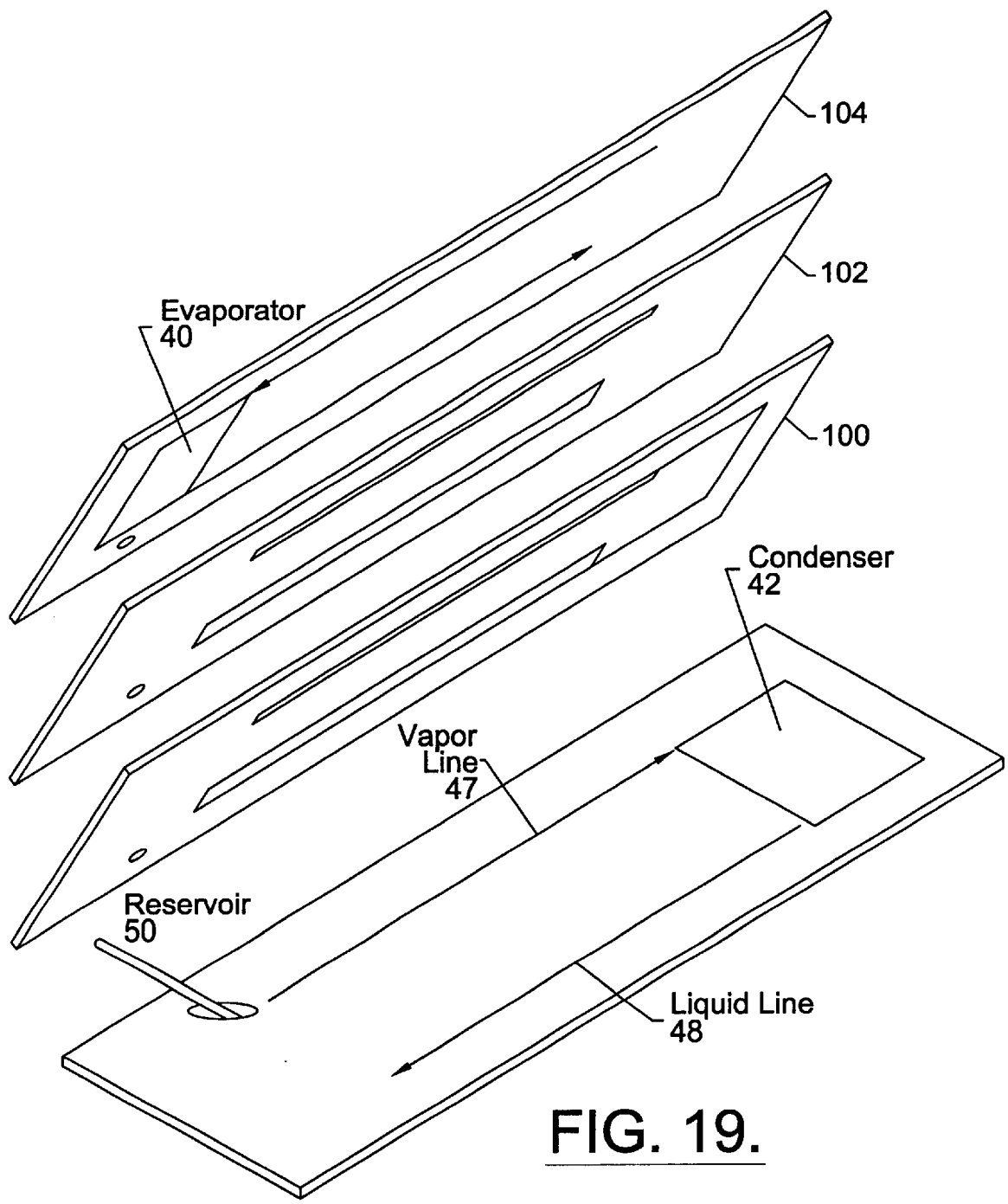
FIG. 19 is another embodiment of the thermally enhanced microcircuit package with the evaporator formed in a different structural layer, as compared to the condenser and interconnecting cooling fluid channels.

FIG. 19 illustrates an embodiment where the condenser is formed within the silicon base, i.e., silicon wafer, while various substrates, such as different ceramic substrate, e.g., low temperature co-fired ceramic, include an evaporator and lines as shown in FIG. 19. Two layers 100, 102 are followed by the evaporator layer 104.

Non-limiting examples of the dimensions for the structure of FIG. 19 are shown below:

| Evaporator Length | 10000 microns |
| --- | --- |
| Evaporator Width | 50000 microns |
| Condenser Area | 7.5e + 09 sq. microns |
| Groove Height | 150 microns |
| Groove Width/Number | 50 microns/50 |
| Vapor Line Width | 2500 × 1300 microns |
| Liquid Line Width | 1000 × 1300 microns |
| Vapor/Liquid Line Length | 30 mm |
| Liquid Line Re Number | 312 |
| Vapor Line Re Number | 4379 |
| Projected Heat Removal | 227 watts |

It is evident that the present invention provides an efficient and easily fabricated, self-contained and enclosed loop system. It is formed as a microelectromechanical (MEMS) cooling module that has a capillary pumped loop cooling circuit with an evaporator, condenser, and interconnecting cooling fluid channels. The fluid used could be alcohol or water, depending on end use application and necessary heat exchange requirements. The wicking structure can be fabricated in a glass wafer, as shown in the steps of FIGS. 13–16, or could be fabricated in silicon, depending on end use requirements. The reservoir ports, including the fill ports, could be relocated and different ports added to aid in filling, and provide direct liquid access to the evaporator.

Temperature measurement wells are also provided as shown in FIG. 18A. The thermocouples would give the temperature in the evaporator, condenser and cooling fluid lines.

Both vertical and horizontal configurations could be fabricated. The structure can be integrated into electronic micro packages, while making the use of high surface-to-volume ratios to enhance heat transport. The structure can make use of micro scale heat transport concepts and can be integrated directly into silicon and SiC electronic packages for high heat flux/high temperature applications, while reducing mass, volume and the cost of thermal management approaches. The integrated cooling circuit decreases the interfaces providing for the potential to increase electronics reliability. Microfins could also be integrated into an electronics package.

The thermally enhanced package, such as the thermally enhanced ball grid array package for the IGBT as illustrated, can be adapted for use with traditional thermal management techniques, and provide multiple interconnect paths for high current applications. It is expandable to include sensing and control interconnects and can be used for circuit isolation, and adjustable over current protection. It can have a software triggable shutdown, or manually triggable shutdown.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A thermally enhanced microcircuit package comprising:
   a microcircuit package having a microcircuit device cavity;
   a microcircuit device received within the microcircuit device cavity; and
   a microelectromechanical (MEMS) cooling module operatively connected to said microcircuit package, said cooling module including a capillary pumped loop cooling circuit having an evaporator, a condenser laterally spaced and separated from the evaporator, and cooling fluid channels interconnecting the evaporator and condenser for passing vapor and fluid between said evaporator and condenser and evaporating and condensing the cooling fluid, wherein said evaporator is operatively associated with said microcircuit device for cooling said microcircuit device when in use.

2. A thermally enhanced microcircuit package according to claim 1, wherein said evaporator and condenser are both formed within a silicon base.

3. A thermally enhanced microcircuit package according to claim 1, wherein said condenser is formed within a silicon base and said evaporator is at least partially formed within said microcircuit package.

4. A thermally enhanced microcircuit package according to claim 1, wherein said microcircuit package is formed of low temperature co-fired ceramic (LTCC).

5. A thermally enhanced microcircuit package according to claim 1, and further comprising a cooling fluid reservoir operatively connected to said evaporator.

6. A thermally enhanced microcircuit package according to claim 1, and further comprising a wicking structure formed within said evaporator.

7. A thermally enhanced microcircuit package according to claim 1, wherein said evaporator and said condenser are formed as a plurality of grooves, each having height and width of about 25 to about 150 microns.

8. A thermally enhanced microcircuit package according to claim 1, wherein said cooling fluid channels are formed as a plurality of vapor lines and a plurality of liquid lines having a length substantially greater than said width and height.

9. A thermally enhanced microcircuit package comprising:
   a microcircuit package having a microcircuit device cavity;
   a microcircuit device received within the microcircuit device cavity; and
   a microelectromechanical (MEMS) cooling module operatively connected to said microcircuit package, said cooling module including a capillary pumped loop cooling circuit having a silicon base and an evaporator, a condenser laterally spaced and separated from the evaporator, and cooling fluid channels formed in said silicon base and interconnecting the evaporator and condenser for passing vapor and fluid between said evaporator and condenser and evaporating and condensing the cooling fluid, wherein said evaporator is operatively associated with said microcircuit device for cooling said device when in use, and a glass cover positioned over said silicon base and closing said evaporator, condenser and interconnecting cooling fluid channels.

10. A thermally enhanced microcircuit package according to claim 9, wherein said evaporator and condenser are both formed within said silicon base.

11. A thermally enhanced microcircuit package according to claim 9, wherein said condenser is formed within said silicon base and said evaporator is formed within said microcircuit package.

12. A thermally enhanced microcircuit package according to claim 9, wherein said microcircuit package is formed of low temperature co-fired ceramic (LTCC) material.

13. A thermally enhanced microcircuit package according to claim 9, and further comprising a cooling fluid reservoir operatively connected to said evaporator.

14. A thermally enhanced microcircuit package according to claim 9, and further comprising a wicking structure formed within said evaporator.

15. A thermally enhanced microcircuit package according to claim 9, wherein said evaporator and said condenser are formed of a plurality of grooves, each having height and width of about 25 to about 150 microns.

16. A thermally enhanced microcircuit package according to claim 9, wherein said cooling fluid channels are formed as a plurality of vapor lines and a plurality of liquid lines, each having a length substantially greater than said width and height.

17. A thermally enhanced ball grid array package comprising:
   a ball grid array package and having a ball grid array and a microcircuit device cavity;
   a microcircuit device received within the microcircuit device cavity; and a microelectromechanical (MEMS) cooling module operatively connected to said ball grid array package, said cooling module including a capillary pumped loop cooling circuit having an evaporator, a condenser laterally spaced and separated from the evaporator and cooling fluid channels interconnecting the evaporator and condenser for passing vapor and fluid between said evaporator and condenser and evaporating and condensing the cooling fluid, wherein said evaporator is operatively associated with said microcircuit device for cooling said device when in use.

18. A thermally enhanced ball grid array package according to claim 17, wherein said microcircuit device is formed as an insulated gate bipolar transistor.

19. A thermally enhanced ball grid array package according to claim 18, and further comprising ribbon bands that aid in securing said insulated gate bipolar transistor to said ball grid array.

20. A thermally enhanced ball grid array package according to claim 17, wherein said evaporator and condenser are both formed within a silicon base.

21. A thermally enhanced ball grid array package according to claim 17, wherein said condenser is formed within a silicon base and said evaporator is formed at least partially within said ball grid array package.

22. A thermally enhanced all grid array package according to claim 17, wherein said ball grid array package is formed of low temperature co-fired ceramic (LTCC).

23. A thermally enhanced ball grid array package according to claim 17, and further comprising a cooling fluid reservoir operatively connected to said evaporator.

24. A thermally enhanced ball grid array package according to claim 17, and further comprising a wicking structure formed within said evaporator.

25. A thermally enhanced ball grid array package according to claim 17, wherein said evaporator and said condenser are formed of a plurality of grooves each having height and width of about 25 to about 150 microns.

26. A thermally enhanced ball grid array package according to claim 17, wherein said cooling fluid channels are formed as a plurality of vapor lines and a plurality of liquid lines, each having a length substantially greater than said width and height.

* * * * *